United States Patent
Ogura et al.

(10) Patent No.: US 12,316,993 B2
(45) Date of Patent: May 27, 2025

(54) PHOTOELECTRIC CONVERSION APPARATUS

(71) Applicant: CANON KABUSHIKI KAISHA, Tokyo (JP)

(72) Inventors: Masanori Ogura, Tokyo (JP); Takuya Hara, Kanagawa (JP); Yoshiaki Miyamoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 110 days.

(21) Appl. No.: 18/167,171

(22) Filed: Feb. 10, 2023

(65) Prior Publication Data

US 2023/0276149 A1    Aug. 31, 2023

(30) Foreign Application Priority Data

Feb. 25, 2022    (JP) .................. 2022-028278

(51) Int. Cl.
*H04N 25/78*    (2023.01)
*H04N 25/671*    (2023.01)
*H04N 25/79*    (2023.01)
*H10F 39/00*    (2025.01)

(52) U.S. Cl.
CPC .......... *H04N 25/78* (2023.01); *H04N 25/671* (2023.01); *H04N 25/79* (2023.01); *H10F 39/8037* (2025.01)

(58) Field of Classification Search
CPC ...... H04N 25/78; H04N 25/671; H04N 25/79; H04N 25/617; H04N 25/677; H01L 27/14612; H10F 39/8037; A23B 99/00
See application file for complete search history.

(56) References Cited

U.S. PATENT DOCUMENTS

| | | |
|---|---|---|
| 7,227,208 B2 | 6/2007 | Ogura |
| 7,321,110 B2 | 1/2008 | Okita |
| 7,408,210 B2 | 8/2008 | Ogura |
| 7,456,880 B2 | 11/2008 | Okita |
| 7,460,162 B2 | 12/2008 | Koizumi |
| 7,514,732 B2 | 4/2009 | Okita |
| 7,550,793 B2 | 6/2009 | Itano |
| 7,605,415 B2 | 10/2009 | Koizumi |

(Continued)

FOREIGN PATENT DOCUMENTS

| | | |
|---|---|---|
| JP | 2008-067107 A | 3/2008 |
| JP | 2011-182065 A | 9/2011 |

(Continued)

*Primary Examiner* — Shahbaz Nazrul
(74) *Attorney, Agent, or Firm* — Venable LLP

(57) ABSTRACT

A photoelectric conversion apparatus comprising: a pixel array; a signal line; a processing circuit; a switch for controlling conduction between the signal line and an input node of the processing circuit; and a control unit. The control unit performs a first transition in which, after resetting of the processing circuit, the switch is transitioned to an OFF state and then, during a period after the floating diffusion is reset during which the pixel signals are read out of the pixels into the signal line, the switch is transitioned at least from the OFF state to an ON state; keeps the switch in the OFF state during a period during which the transfer transistor is performing the transfer; and performs a second transition in which, after the transfer, the switch is transitioned from the OFF state to the ON state.

15 Claims, 12 Drawing Sheets

(56) References Cited

U.S. PATENT DOCUMENTS

| | | |
|---|---|---|
| 7,629,568 B2 | 12/2009 | Koizumi |
| 7,638,826 B2 | 12/2009 | Hiyama |
| 7,679,658 B2 | 3/2010 | Sakurai |
| 7,808,537 B2 | 10/2010 | Fujimura |
| 7,812,873 B2 | 10/2010 | Hiyama |
| 7,812,876 B2 | 10/2010 | Hiyama |
| 7,906,755 B2 | 3/2011 | Koizumi |
| 7,907,196 B2 | 3/2011 | Ogura |
| 7,943,975 B2 | 5/2011 | Koizumi |
| 7,948,540 B2 | 5/2011 | Ogura et al. |
| 7,978,241 B2 | 7/2011 | Koizumi |
| 8,134,190 B2 | 3/2012 | Okita |
| 8,169,525 B2 | 5/2012 | Ryoki |
| 8,174,600 B2 | 5/2012 | Ogura |
| 8,207,561 B2 | 6/2012 | Koizumi |
| 8,218,050 B2 | 7/2012 | Ogura |
| 8,390,708 B2 | 3/2013 | Koizumi |
| 8,411,178 B2 | 4/2013 | Ogura |
| 8,416,329 B2 | 4/2013 | Hiyama |
| 8,441,558 B2 | 5/2013 | Okita |
| 8,477,224 B2 | 7/2013 | Ogura |
| 8,493,487 B2 | 7/2013 | Takada |
| 8,520,102 B2 | 8/2013 | Ogura |
| 8,520,108 B2 | 8/2013 | Ogura |
| 8,552,481 B2 | 10/2013 | Hiyama |
| 8,624,307 B2 | 1/2014 | Koizumi |
| 8,698,935 B2 | 4/2014 | Okita |
| 8,749,675 B2 | 6/2014 | Koizumi |
| 8,754,973 B2 | 6/2014 | Ikuma |
| 8,823,849 B2 | 9/2014 | Hiyama |
| 8,896,029 B2 | 11/2014 | Koizumi |
| 8,928,790 B2 | 1/2015 | Ogura |
| 9,124,830 B2 | 9/2015 | Ogura |
| 9,305,954 B2 | 4/2016 | Kato |
| 9,595,559 B2 | 3/2017 | Hiyama |
| 9,812,473 B2 | 11/2017 | Miyamoto |
| 10,021,325 B2 | 7/2018 | Miyamoto |
| 10,044,964 B2 | 8/2018 | Itano |
| 10,225,496 B2 | 3/2019 | Ogura |
| 10,685,993 B2 | 6/2020 | Hiyama |
| 10,992,886 B2 | 4/2021 | Yamazaki |
| 11,121,160 B2 | 9/2021 | Suzuki |
| 11,252,368 B2 | 2/2022 | Ogura |
| 11,387,273 B2 | 7/2022 | Ogura |
| 2008/0062296 A1 | 3/2008 | Ogura |
| 2011/0198482 A1 | 8/2011 | Ogura |
| 2012/0320246 A1 | 12/2012 | Ikuma et al. |
| 2015/0172581 A1 | 6/2015 | Itano et al. |
| 2019/0104260 A1* | 4/2019 | Izuhara .............. H03K 19/1735 |
| 2020/0084397 A1* | 3/2020 | Yamazaki ............ H04N 25/701 |
| 2020/0328240 A1 | 10/2020 | Hiyama |

FOREIGN PATENT DOCUMENTS

| | | |
|---|---|---|
| JP | 2015-119340 A | 6/2015 |
| JP | 2020-043450 A | 3/2020 |

* cited by examiner

PHOTOELECTRIC CONVERSION APPARATUS

BACKGROUND OF THE INVENTION

Field of the Invention

The present disclosure relates to a photoelectric conversion apparatus.

Description of the Related Art

A CMOS image sensor (photoelectric conversion apparatus) has a plurality of pixels including photoelectric conversion elements and read-out circuits that read signals out of these pixels. When the pixels are arranged in a vertical/horizontal two-dimensional configuration, in a horizontal direction the read-out circuits, the number of which correspond to that of the pixels, are arranged. Each of the read-out circuits has a gain function, a subtraction function, a sample-hold function, an analog-digital conversion function, and the like in combination.

Japanese Patent Application Publication No. 2008-67107 proposes a technique of preventing a potential fluctuation in a floating diffusion due to a transfer pulse φTX in a pixel from fluctuating an input capacitance of an amplifier via a vertical signal line. Specifically, Japanese Patent Application Publication No. 2008-67107 inserts a cut-off switch between the vertical signal line and the input capacitance of a column amplifier to turn OFF the switch such that a φTX period is included. By providing the cut-off switch with a CMOS configuration including an NMOS and a PMOS and by inputting reverse-phase pulses to respective gates thereof, the potential fluctuation in the input capacitance of the column amplifier due to φPVLOFF is cancelled out.

SUMMARY OF THE INVENTION

The first aspect of the disclosure is a photoelectric conversion apparatus comprising: a pixel array having a plurality of pixels each including a photodiode, a floating diffusion, and a transfer transistor configured to transfer a charge from the photodiode; a signal line to which pixel signals are output from the pixels; a processing circuit configured to process the pixel signals in the signal line; a switch configured to control conduction between the signal line and an input node of the processing circuit; and a control unit, wherein the control unit is configured to perform a first transition in which, after resetting of the processing circuit, the switch is transitioned to an OFF state and then, during a period after the floating diffusion is reset during which the pixel signals are read out of the pixels into the signal line, the switch is transitioned at least from the OFF state to an ON state, wherein the control unit is configured to keep the switch in the OFF state during a period during which the transfer transistor is performing the transfer, and wherein the control unit is configured to perform a second transition in which, after the transfer, the switch is transitioned from the OFF state to the ON state.

According to the present disclosure, it is possible to provide a photoelectric conversion apparatus that allows a potential fluctuation in a processing circuit to be cancelled out and allows a high-quality signal to be acquired.

Further features of the present invention will become apparent from the following description of exemplary embodiments with reference to the attached drawings.

DESCRIPTION OF THE EMBODIMENTS

Figure 1:
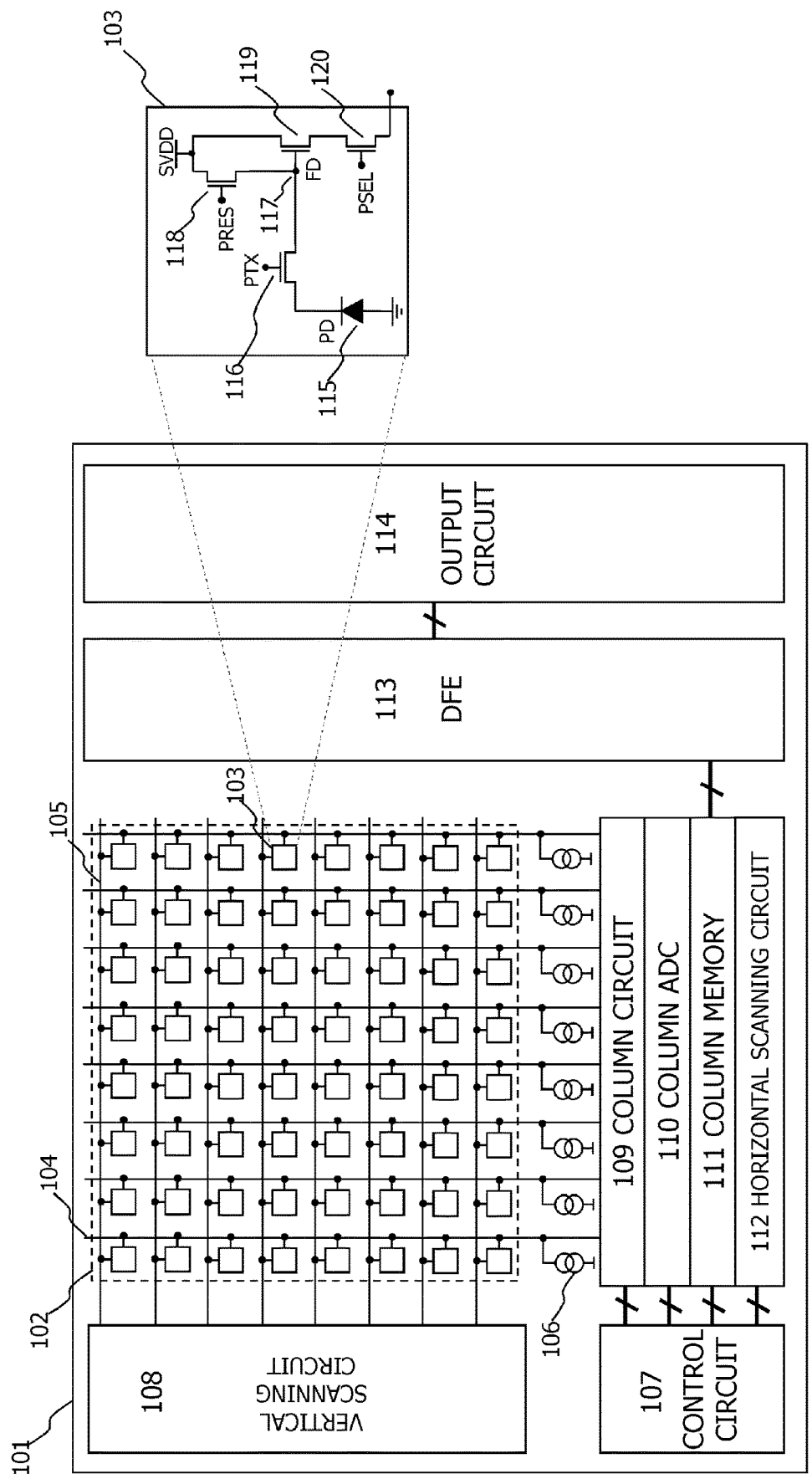
FIG. 1 is a schematic diagram of a photoelectric conversion apparatus in a first embodiment.

In recent years, image sensors mounted in cameras or smartphones have become increasingly higher in sensitivity and gain. As a result, merely providing a cut-off switch with a CMOS configuration and inputting reverse-phase pulses to respective gates is becoming insufficient to cancel out a potential fluctuation in a column circuit (processing circuit). Consequently, a dark offset or dark shading is undesirably included to possibly degrade a signal quality.

The present disclosure relates to a technology of providing a photoelectric conversion apparatus that allows a potential fluctuation in a processing circuit to be cancelled out and allows a high-quality signal to be acquired.

First Embodiment

Referring to FIGS. 1 to 4, an embodiment of a photoelectric conversion apparatus (solid-state image capturing apparatus) according to a first embodiment of the present disclosure will be described. A photoelectric conversion apparatus 101 illustrated in FIG. 1 has a pixel array 102, the pixel array 102 has a plurality of unit pixels 103, and the plurality of unit pixels 103 are arranged in a matrix configuration. A plurality of vertical signal lines 104 are provided to correspond to pixel columns, and the pixels 103 in the individual columns of the pixel array 102 output pixel signals via the vertical signal lines 104. Meanwhile, the pixels 103 in individual rows of the pixel array 102 are connected to control signal lines 105 to be driven on the basis of control signals supplied via the control signal lines 105. To the vertical signal lines 104, constant current loads 106 are connected.

The photoelectric conversion apparatus 101 also includes a control circuit 107, a vertical scanning circuit 108, a column circuit 109, a column ADC 110, a column memory 111, a horizontal scanning circuit 112, a DFE 113, and an output circuit 114. The control circuit 107 controls each of blocks in the photoelectric conversion apparatus 101. The vertical scanning circuit 108 selectively drives the control signal lines 105. The column circuit 109 processes the signals from the vertical signal lines. The column ADC (analog-digital converter) 110 performs analog-digital conversion (hereinafter referred to as the AD conversion) of an analog signal output from the column circuit 109. The column memory 111 holds a digital signal output from the column ADC 110. The horizontal scanning circuit 112 reads out the digital signals held in the column memory 111. The DFE (Digital Front End) 113 performs signal processing such as horizontal clamping on the digital signal read out of the horizontal scanning circuit 112. The output circuit 114 outputs the digital signal processed in the DFE 113.

Next, a description will be given of a configuration of each of the unit pixels 103. As illustrated in a partially enlarged view in FIG. 1, the unit pixel 103 includes a photodiode 115, a transfer transistor 116, a floating diffusion terminal (FD terminal) 117, a reset transistor 118, a source follower transistor 119, and a row selection transistor 120. The photodiode 115 photoelectrically converts incident light to generate charges corresponding to an amount of the incident light. The transfer transistor 116 transfers, in response to a PTX signal supplied from the control signal line 105 to the gate thereof, the charges accumulated in the photodiode 115 to the FD terminal 117. The reset transistor 118 resets, in response to a PRES signal supplied from the control signal line 105 to the gate thereof, the charges in the FD terminal 117. The source follower transistor 119 outputs a voltage signal corresponding to the charges held in the FD terminal 117. The row selection transistor 120 outputs, in response to a PSEL signal supplied from the control signal line 105 to the gate thereof, the pixel signal to the vertical signal line 104.

Figure 2:
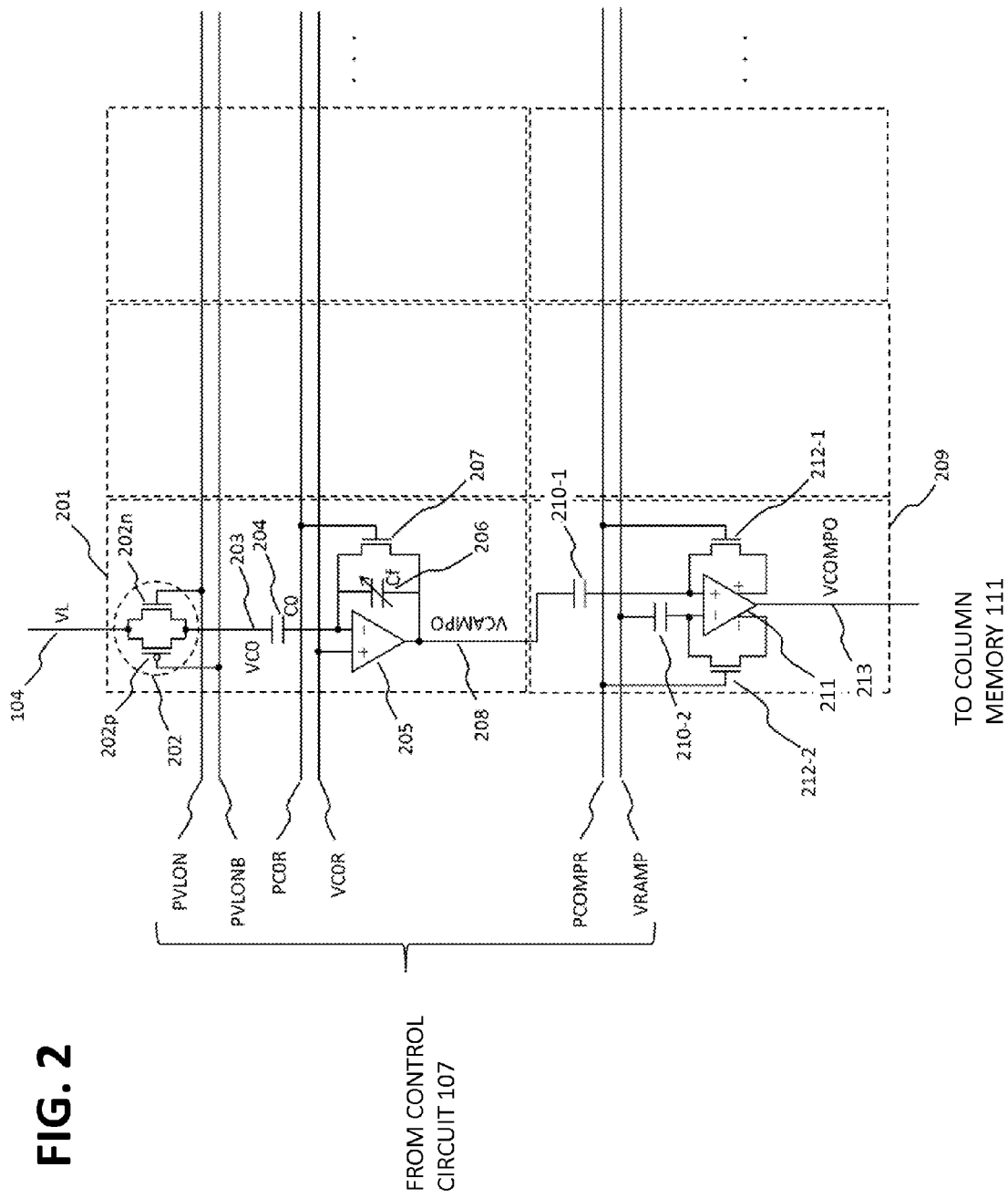
FIG. 2 is an equivalent circuit diagram of a unit circuit in the first embodiment.

FIG. 2 is a schematic diagram of an equivalent circuit diagram of the column circuit 109 and the column ADC 110.

The column circuit 109 serving as a processing circuit includes a plurality of unit column circuits 201 arranged in a horizontal direction. Each of the unit column circuits 201 has a cut-off switch 202 and an amplifier 205, and amplifies and outputs a signal supplied from the vertical signal line (VL) 104 serving as a signal line.

The cut-off switch 202 includes an NMOS switch 202n and a PMOS switch 202p which are connected in parallel. To a gate of the NMOS switch 202n, a control signal PVLON is supplied while, to a gate of the PMOS switch 202p, a control signal PVLONB corresponding to a reverse-phase signal thereof is supplied. In other words, the NMOS switch 202n and the PMOS switch 202p are driven by the signals with logic levels opposite to each other. The cut-off switch 202 is provided between the vertical signal line 104 and an input node of the column circuit. When the cut-off switch 202 is in an ON state, the vertical signal line (VL) 104 and a column circuit input terminal (VC0) 203 are connected to each other while, when the cut-off switch 202 is in an OFF state, the vertical signal line (VL) 104 and the column circuit input terminal (VC0) 203 are cut off from each other. Thus, the cut-off switch 202 controls conduction and non-conduction of an electric path between the signal line and the input node of the processing circuit. The vertical signal line 104 is capacitively coupled via the cut-off switch 202, the input terminal 203, and an input capacitance (C0) 204 to be connected to a first input terminal (inverting input terminal) of the amplifier 205 of the processing circuit. The amplifier 205 is a capacitive feedback type amplifier, and an output thereof is connected to the first input terminal (inverting input terminal) via a feedback capacitance (Cf) 206. The feedback capacitance 206 is a variable capacitance, and a capacitance value thereof can be set by a control signal (not shown) supplied from the control circuit 107. A reset switch 207 is provided in parallel to the feedback capacitance 206 and controlled by a control signal PC0R. To a second input terminal (non-inverting input terminal) of the amplifier 205, a voltage VC0R is supplied. An output from the amplifier 205 is supplied to the column ADC 110 via an output terminal (VCAMPO) 208.

The column ADC 110 includes a plurality of unit column ADC circuits 209 arranged in the horizontal direction. Each of the unit column ADC circuits 209 has a comparator 211, converts an analog signal supplied from the unit column circuit 201 to a digital signal, and outputs the digital signal. The signal from the unit column circuit 201 is input via a capacitance 210-1 to a first input terminal (inverting input terminal) of the comparator 211. A ramp signal VRAMP is input via a capacitance 210-2 to a second input terminal (non-inverting input terminal) of the comparator 211. Respective capacitance values of the capacitances 210-1 and 210-2 are CIN-1 and CIN-2. To each of gates of an NMOS switch 212-1 and an NMOS switch 212-2, a control signal PCOMPR is supplied. An output from the comparator 211 is output via an output terminal (VCOMPO) 213 to the column memory 111.

Figure 3:
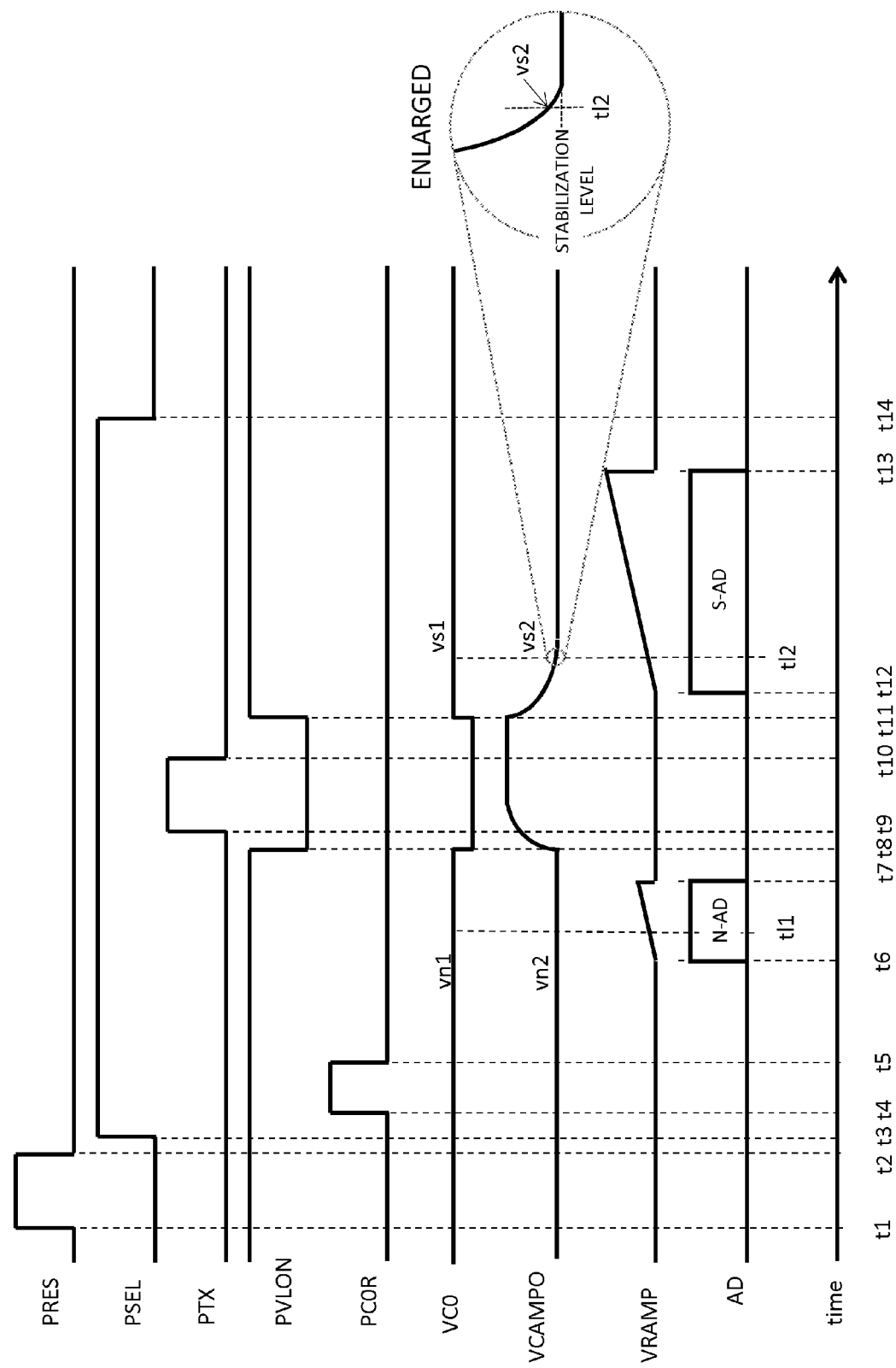
FIG. 3 is a timing chart illustrating a read-out operation according to a reference example.

FIG. 3 is a timing chart illustrating a reference example of a read-out operation in the photoelectric conversion apparatus 101. FIG. 3 illustrates the read-out operation performed on the plurality of unit pixels 103 arranged in the horizontal direction in a given selected row, which is referred to also as an 1H operation. By performing the 1H operation in the plurality of rows, it is possible to read out the pixel signals from all the rows and all the columns.

Referring to FIG. 3, a description will be given below of the read-out operation and a problem to be solved in the reference example. First, during a period t1 to t2, a pulse PRES shifts to a Hi level to turn ON each of the reset transistors 118 and reset the FD terminal 117 to a potential SVDD. Then, during a period t3 to t14, the PSEL shifts to the Hi level to turn ON the row selection transistor 120, and a source terminal of the source follower transistor 119 is electrically connected to the vertical signal line 104. Then, during a period t4 to t5, the PC0R shifts to the Hi level to turn ON each of the reset switches 207, and each of potentials at the input terminal (VC0) 203 and the output terminal (VCAMPO) 208 becomes the potential VC0R to thereby initialize the column circuit.

During a period t3 to t8, when a potential vn1 corresponding to a reset level for the FD terminal, which has been read into the vertical signal line, is input to the input terminal (VC0) 203 of the column circuit, a potential vn2 is output to the output terminal (VCAMPO) 208 of the column circuit serving as an inverting circuit. Next, during an N-AD period during a period t6 to t7, the potential vn2 at the VCAMPO terminal 208 is AD-converted in the column ADC 110, and a digital signal vn2d corresponding to the potential vn2 at a time t11 is held in the column memory 111. The time t11 mentioned herein refers to timing with which the comparator 211 is inverted when the vn2 input to the comparator 211 becomes equal to a VRAMP signal.

During a period t8 to t10, the cut-off switch 202 is turned OFF to disconnect the vertical signal line (VL) 104 from the input terminal (VC0) 203 of the column circuit 203. As a result, a potential fluctuation at the FD terminal 117 due to a transition of the pulse PTX during a subsequent period t9 to t10 is transmitted to the vertical signal line (VL) 104, but is not transmitted to the input terminal (VC0) 203 of the column circuit.

During a period after t10, a signal is read out of the photodiode 115 to the FD terminal 117, and read out as a potential vs1 to the vertical signal line (VL) 104. On the vs1, an electric signal resulting from photoelectrical conversion to the reset potential vn1 in the photodiode is superimposed. In a dark state, vn1=vs1 is satisfied. Then, during a period after t11, when the cut-off switch 202 is turned ON and the vs1 is input to the input terminal (VC0) 203 of the column circuit, a potential vs2 is output to the output terminal (VCAMPO) 208 corresponding to the output of the column circuit serving as the inverting circuit. Then, during an S-AD period during a period t12 to t13, the potential vs2 at the VCAMPO terminal 208 is AD-converted in the column ADC 110, and a digital signal vs2d corresponding to the potential vs2 at a time t12 is held in the column memory 111. During the N-AD period during the period t6 to t7, a ramp voltage VRAMP is input to the comparator 211, while the potential vs2 at the VCAMPO terminal is also input to the comparator 211. At the time t11 at which the VRAMP voltage coincides with the vn2, the comparator is inverted, and a count value is held as the vn2d in the column memory 111. During a S-AD period during a period t12 to t13 also, at the time t12 at which the VRAMP signal and the vs2 are compared to and coincide with each other, the comparator 211 is inverted, and a count value is held as the vs2d in the column memory 111.

During a period after t14, the digital values vn2d and vs2d held in the memory 111 are read out by the horizontal scanning circuit 112 to be input to the DFE 113, and digital signal processing is performed. As typical processing, subtraction processing vn2d-vs2d is performed. After such digital signal processing is performed, the resulting signal is read out of the output circuit 114 to the outside of the photoelectric conversion apparatus 101.

A problem to be solved associated with the above-mentioned read-out operation using the cut-off switch 202 will be described herein. According to the above-mentioned read-out operation, as described in Japanese Patent Application Publication No. 2008-67107, by using the cut-off switch 202, it is possible not to input a fluctuation in the vertical signal line (VL) 104 due to the transition of the PTX to the column circuit as the inverting circuit. However, in Japanese Patent Application Publication No. 2008-67107, it is not examined that the turning OFF/ON of the cut-off switch 202 slightly fluctuates a potential at the input terminal (VC0) 203.

As long as conditions for the NMOS transistor 202n and those for the PMOS transistor 202p each included in the cut-off switch 202 are the same, due to a CMOS configuration, it is possible to cancel out a slight fluctuation observed at the input terminal (VCO) 203. Consequently, a potential in the vertical signal line (VL) 104 during a period t6 to t7 is the same as that during a period t8 to t11. Note that examples of the conditions for the NMOS transistor 202n and those for the PMOS transistor 202p include respective sizes, gate overlap capacitances, charge injections, thresholds, and the like.

However, in terms of manufacturing, the respective conditions for the transistors are not the same. Consequently, during the period t8 to t11, the potential in the vertical signal line (VL) 104 fluctuates, though slightly, as illustrated in FIG. 3. In addition, in recent cameras and smartphones, to allow photographing even in a dark scene, gains of read-out circuits are increased in most cases as an approach to increase sensitivities. For example, the amplifier 205 included in each of the unit column circuits 201 is used to apply a gain. The gain is determined by a capacitance ratio C0/Cf, and the variable capacitance of the feedback capacitance (Cf) 206 previously described is controlled to determine the gain C0/Cf. Since the gain is thus applied, the input capacitance 204, the amplifier 205, the feedback capacitance 206, and the reset switch 207 that are included between the VC0 terminal 203 and the VCAMPO terminal 208 are mostly referred to generally as a column amplifier.

When the gain C0/Cf has a large value, e.g., a value tens to hundreds of times larger, bandwidths over which the amplifier 205 operates become a low frequency region, and stabilization of the output VCAMPO from the column circuit 208 becomes extremely slow. When a description will be given with reference to the timing chart in FIG. 3, a potential fluctuation at the VC0 terminal 203 caused by the operation of the cut-off switch during the period t8 to t11 is fast, and the vn1 at the time t11 and the vs1 at the time t12 are at the same potential. However, the stabilization of the output VCAMPO from the column amplifier 208 to which the potential fluctuation at the VC0 during the period t8 to t11 is input is extremely slow and, as illustrated in a partially enlarged view in FIG. 3, the vn2 at the time t11 and the vs2 at the time t12 are at different potentials. In other words, a relationship given by vn2<vs2 is established. As a result, a problem arises in that a dark offset occurs, a precise black level cannot be determined, and a high-quality image cannot be acquired.

Accordingly, the present disclosure proposes a method of cancelling the dark offset caused by the turning ON/OFF of the cut-off switch 202.

Figure 4:
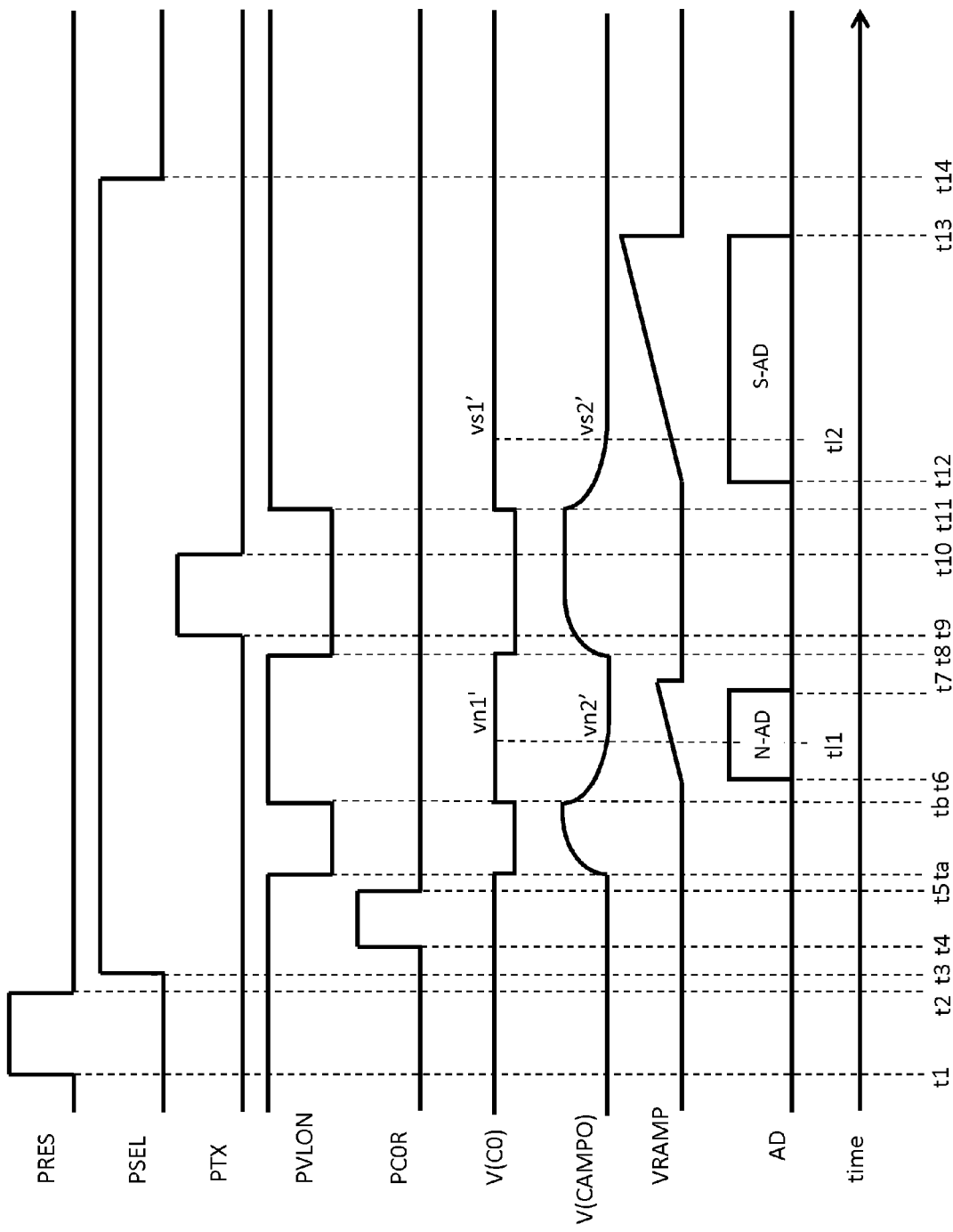
FIG. 4 is a timing chart illustrating a read-out operation in the first embodiment.

FIG. 4 is a timing chart illustrating the read-out operation in the photoelectric conversion apparatus 101 according to the present embodiment. In the present embodiment, to the read-out operation illustrated in FIG. 3, an operation period ta to tb for the cut-off switch is added. Note that the period ta to tb is provided after the completion of the resetting of the column circuit 208 and before th N-AD period.

In the present embodiment, the control circuit (control unit) 107 performs the following control. In other words, during a period after the FD terminal 117 is reset during which the pixel signals are read out into the vertical signal line 104, the cut-off switch is transitioned from the OFF state to the ON state (first transition). Then, during a period during which the transfer transistor 116 is transferring the charges accumulated in the photodiode to the FD terminal 117, the cut-off switch 202 maintains the OFF state. Then, after the transfer by the transfer transistor 116 is completed, the cut-off switch 202 is transitioned from the OFF state to the ON state (second transition). The cutting off of the cut-off switch 202 due to the first transition described above is performed before an N signal (reset signal) is AD-converted and, after the first transition, the N signal is AD converted (N-AD). Meanwhile, the cutting off of the cut-off switch 202 due to the second transition described above is performed before an S signal is AD-converted and, after the second transition, the S signal is AD-converted (S-AD).

During the period ta to tb after the FD terminal 117 is reset, by causing the PVLON to fall at a time ta and raising the PVLON at a time tb, the cut-off switch 202 is operated. As a result, in response to a potential fluctuation at the VC0 terminal 203 caused by the operation of the cut-off switch 202 during the period ta to tb, the output VCAMPO from the column amplifier 208 fluctuates, and the stabilization thereof becomes extremely slow. Consequently, a vn2' at the time t11 is at a potential extremely close or equal to a vs2' at the time t12 during the subsequent period t8 to t11. During a period t5 to t8, a signal corresponding to the reset potential for the FD terminal 117 is output from the output VCAMPO of the column amplifier. By setting the stabilization of the output VCAMPO from the column amplifier at the time tb and later to the same degree as that of the stabilization thereof at the time t11 and later, the output VCAMPO from the column amplifier in FIG. 4 satisfies vn2'=vs2'.

The vn2' and vs2' corresponding to the outputs from the VCAMPO terminal 208 of the column amplifier are respectively AD-converted to digital signals vn2$d'$ and vs2$d'$ during the N-AD period and during the S-AD period. The digital signals vn2$d'$ and vs2$d'$ are held in the memory 111. The digital signals vn2$d'$ and vs2$d'$ are read out by the horizontal scanning circuit 112 at a time t14 or later. Then, the digital signals vn2$d'$ and vs2$d'$ are input to the DFE 113 and subjected to digital signal processing. As typical processing, subtraction processing vn2$d'$-vs2$d'$ is performed to be able to cancel an offset due to insufficient stabilization of the output VCAMPO from the column amplifier 208, which is caused by the operation of the cut-off switch 202. As a result, it is possible to form a high-quality image with an extremely small offset.

Second Embodiment

Figure 5:
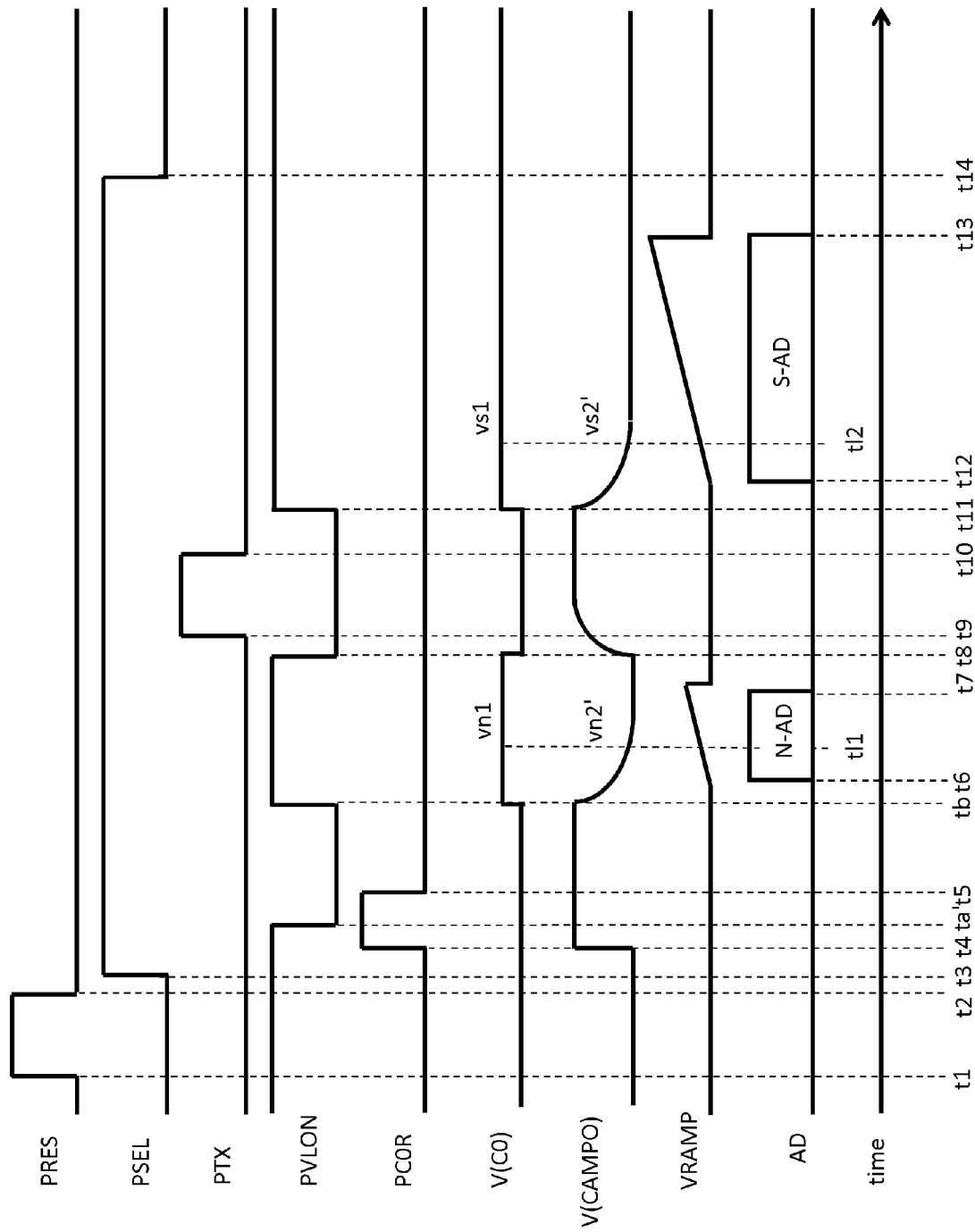
FIG. 5 is a timing chart illustrating the read-out operation in a second embodiment.

Referring to FIG. 5, a description will be given of a second embodiment of the present disclosure. FIG. 5 is a timing chart illustrating the read-out operation in the photoelectric conversion apparatus 101 in the present embodiment. Note that a configuration of the photoelectric conversion apparatus 101 is the same as that in the first embodiment (FIGS. 1 and 2).

In the present embodiment, during a period ta' to tb, the PVLON is transitioned to operate the cut-off switch 202. A time ta' is a time during the period t4 to t5 during which the amplifier 105 is reset. In the present embodiment, while the amplifier 105 is reset, the transition switch is transitioned to the OFF state and, after the amplifier 105 is reset, the cut-off switch 202 is transitioned to the ON state. In th first embodiment (FIG. 4), between times t5 and t6 after the resetting of the amplifier 105, the PVLON is caused to fall while, in the present embodiment, the PVLON is caused to fall while the amplifier 105 is reset.

During the period t4 to t5, a state in which the column amplifier is reset by the reset switch 207 is observed, the column amplifier serves as a unity gain amplifier, the operation thereof is fast, and the stabilization of the VCAMPO terminal 208 is fast. From the output VCAMPO, the voltage VC0R is output. Even when the cut-off switch 202 is operated during the period t4 to t5, the VCAMPO terminal 208 has no great fluctuation, and merely outputs the voltage VC0R. Then, at the time tb, the PVLON is raised and, by the raising of the PVLON at the time tb, the cut-off switch 202 is operated. As a result, a fluctuation at the VCAMPO corresponding to the output of the column amplifier which occurs in response to a potential fluctuation at the VC0 terminal 203 caused by the operation of the cut-off switch 202 during a period tb to t8 is stabilized extremely slowly. Consequently, the vn2' at the time t11 is at a potential extremely close or equal to the vs2' at the time t12 during the subsequent period t8 to t11. During the period t5 to t8, the signal corresponding to the reset potential for the FD terminal 117 is output from the output VCAMPO of the column amplifier 208.

By setting the stabilization of the output VCAMPO from the column amplifier at the time tb and later to the same degree as that of the stabilization thereof at the time t11, the output VCAMPO from the column amplifier in FIG. 4 satisfies vn2'=vs2'. Also, in the present embodiment, it is possible to reduce a duration of a period t5 to tb and thereby shorten a 1H period, and therefore a frame rate can be increased to be higher than that in the first embodiment.

Third Embodiment

Figure 6:
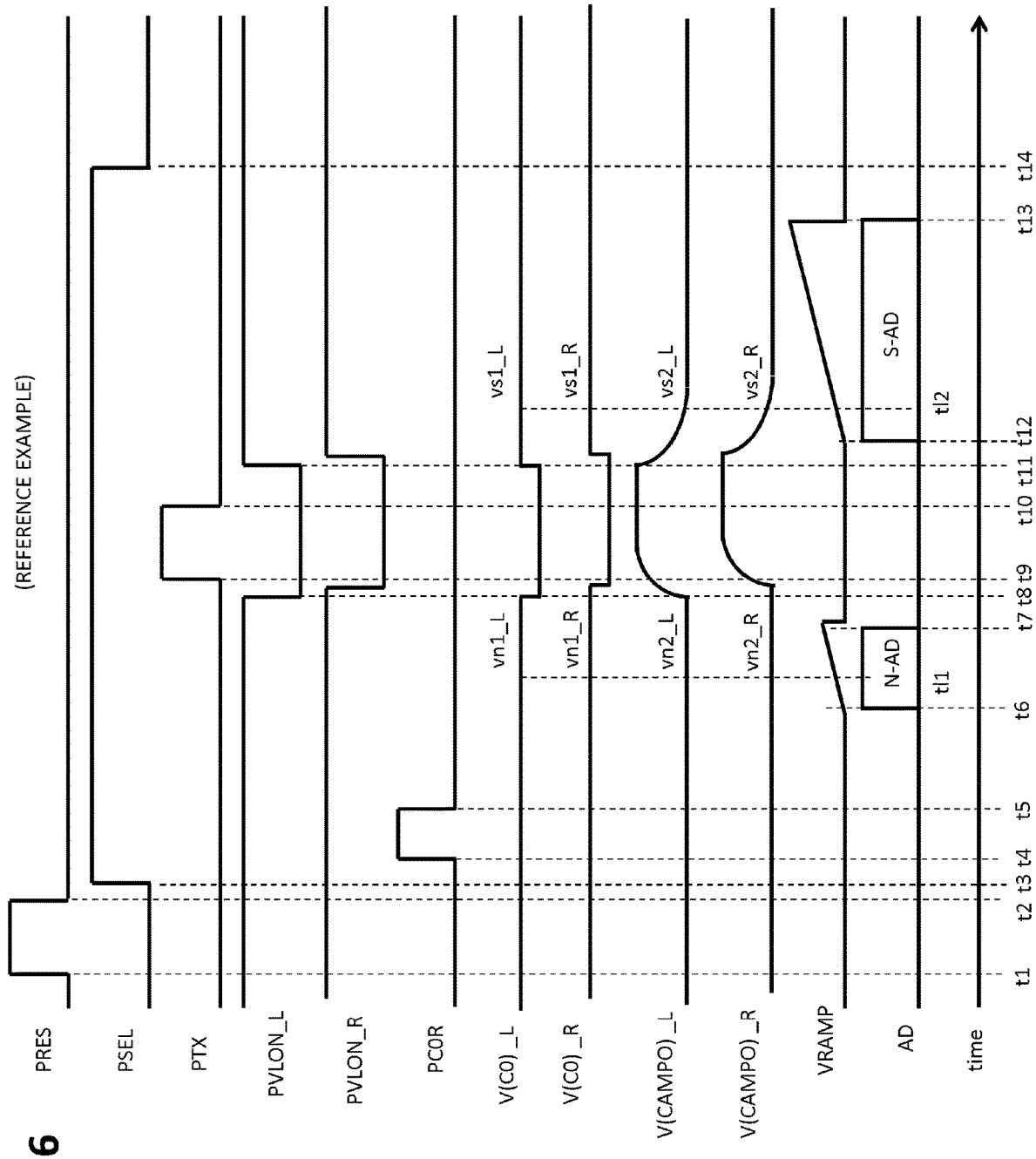
FIG. 6 is a timing chart illustrating the read-out operation according to the reference example.
Figure 7:
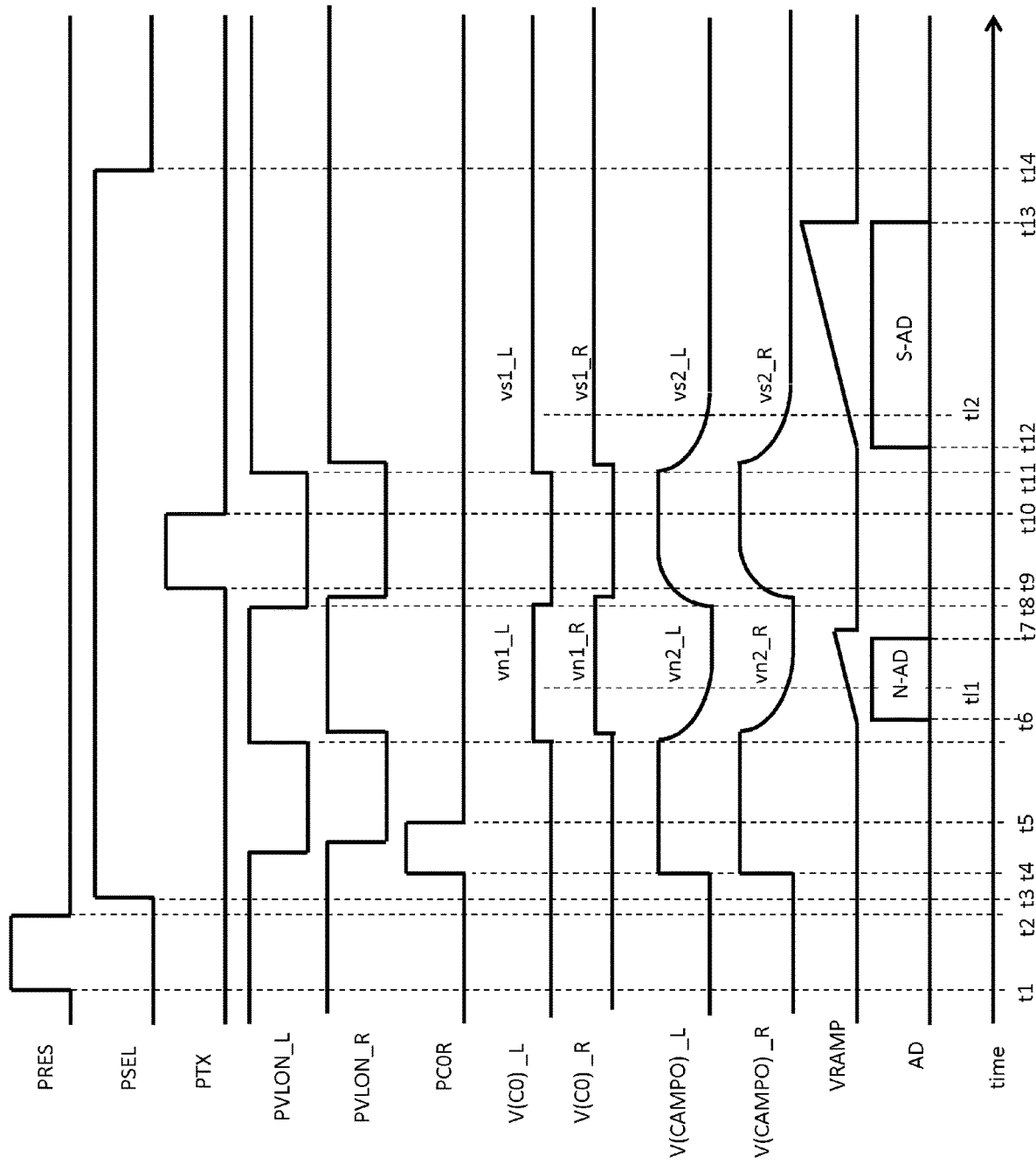
FIG. 7 is a timing chart illustrating the read-out operation in a third embodiment.

Referring to FIGS. 6 and 7, a third embodiment of the present disclosure will be described. FIG. 6 is a timing chart showing the read-out operation according to a reference example for describing a problem to be solved. FIG. 7 is a timing chart illustrating the read-out operation according to the present embodiment. Additional characters "L" and "R" in FIGS. 6 and 7 represent respective signals in left and right columns in the column circuit. Note that the configuration of the photoelectric conversion apparatus 101 is the same as that in the first embodiment (FIGS. 1 and 2). The control circuit is disposed on a left side of the column circuit, and the control signal is supplied from the left side of the column circuit.

First, a description will be given of the problem to be addressed in the present embodiment. In the photoelectric conversion apparatus 101, from the control circuit 107, the control signal, a voltage, and the like are supplied to each of the column circuit 109, the column ADC 110, the column memory 111, and the horizontal scanning circuit 112. In the column ADC 110 or the column memory 111 to which the high-speed control signal is supplied, a repeat buffer is disposed to attempt to reduce a delay of the control signal. Meanwhile, the column circuit 109 is a circuit block that applies a gain mainly to an analog signal and performs a S/H operation and, in the same manner as in the pixel array 102, a pattern layout or the like is preferably placed with a constant periodicity. When the repeat buffer is disposed, it may be possible that the periodicity is lost, and fixed pattern noise (FPN) or the like occurs in the analog signal on a per column circuit basis. As a result, the control signal PVLON to the column circuit 109 that handles the analog signal is supplied in one direction from the left of the control circuit 107, and consequently a delay occurs as in FIG. 6. Since the control signal PVLON is more delayed on the right side than on the left side closer to the control circuit 107, a transition period is delayed. In response thereto, the stabilization of the VCAMPO terminal 208 becomes slower on the right side than on the left side. Meanwhile, a delay in the signal supplied to the column ADC 110 or the column memory 111 is reduced by the repeat buffer, and consequently an AD conversion timing difference between the left side and the right side is smaller. Accordingly, the offset is larger in vs2'_R than in vs2'_L to cause dark shading.

Therefore, in the present disclosure, a method of cancelling the dark offset occurring depending on a delay amount difference between the individual columns is proposed.

FIG. 7 is a timing chart illustrating the read-out operation in the photoelectric conversion apparatus 101 in the present embodiment.

During the period ta' to tb, the PVLON is transitioned to operate the cut-off switch 202. In the present embodiment also, the control signal PVLON is supplied in one direction from the left of the control circuit 107, and consequently a delay occurs as in FIG. 7.

On the left side of the column circuit 109, the PVLON is raised at the time tb and, by the raising of the PVLON at the time tb, the cut-off switch 202 is operated. As a result, in response to a potential fluctuation of a voltage at the VC0 terminal 203 caused by the operation of the cut-off switch 202 during the period tb to t8, the output VCAMPO from the column amplifier 208 fluctuates, and the stabilization thereof becomes extremely slow. Consequently, a vn2'_L at the time t11 is at a potential extremely close or equal to the vs2'_L at the time t12 during the subsequent period t8 to t11.

On the right side of the column circuit 109, the PVLON is raised with a delay from the time tb and, by the raising of the PVLON with the delay from the time tb, the cut-off switch 202 is operated. Accordingly, a potential fluctuation at the VC0 terminal 203 caused by the operation of the cut-off switch 202 is delayed from that during the period tb to t8. In response to the potential fluctuation at the VC0 terminal 203, the output VCAMPO from the column amplifier 208 fluctuates, and the stabilization thereof becomes extremely slow. As a result, a vn2'_R at the time t11 is at a potential extremely close or equal to the vs2'_R at the time t12 during the subsequent period t8 to t11.

Of the vn2'_L and the vn2'_R, the vn2'_R is larger and, of the vs2'_L and the vs2'_R, the vs2'_R is larger. However, as described previously, since vn2'_L=vs2'_L and vn2'_R=vs2'_R are satisfied, when the AD conversion is performed thereafter in the column ADC 110 and respective subtractions are performed in the DFE 113, the left and right offsets are eliminated, and the dark shading is also eliminated. As a result, it is possible to form a high-quality image with an extremely small offset and extremely small dark shading.

Fourth Embodiment

Figure 8:
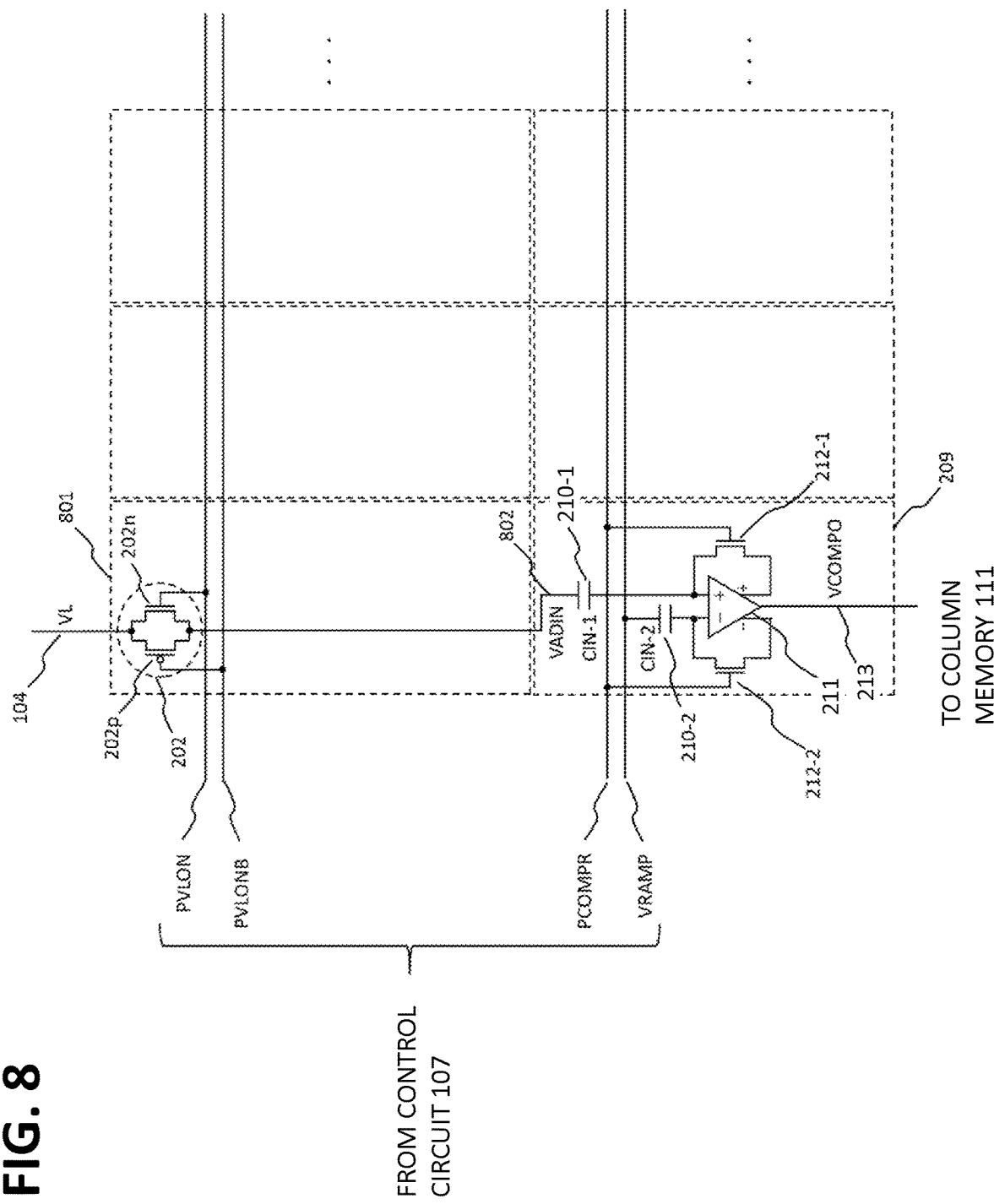
FIG. 8 is an equivalent circuit diagram of a unit circuit in a fourth embodiment.
Figure 9:
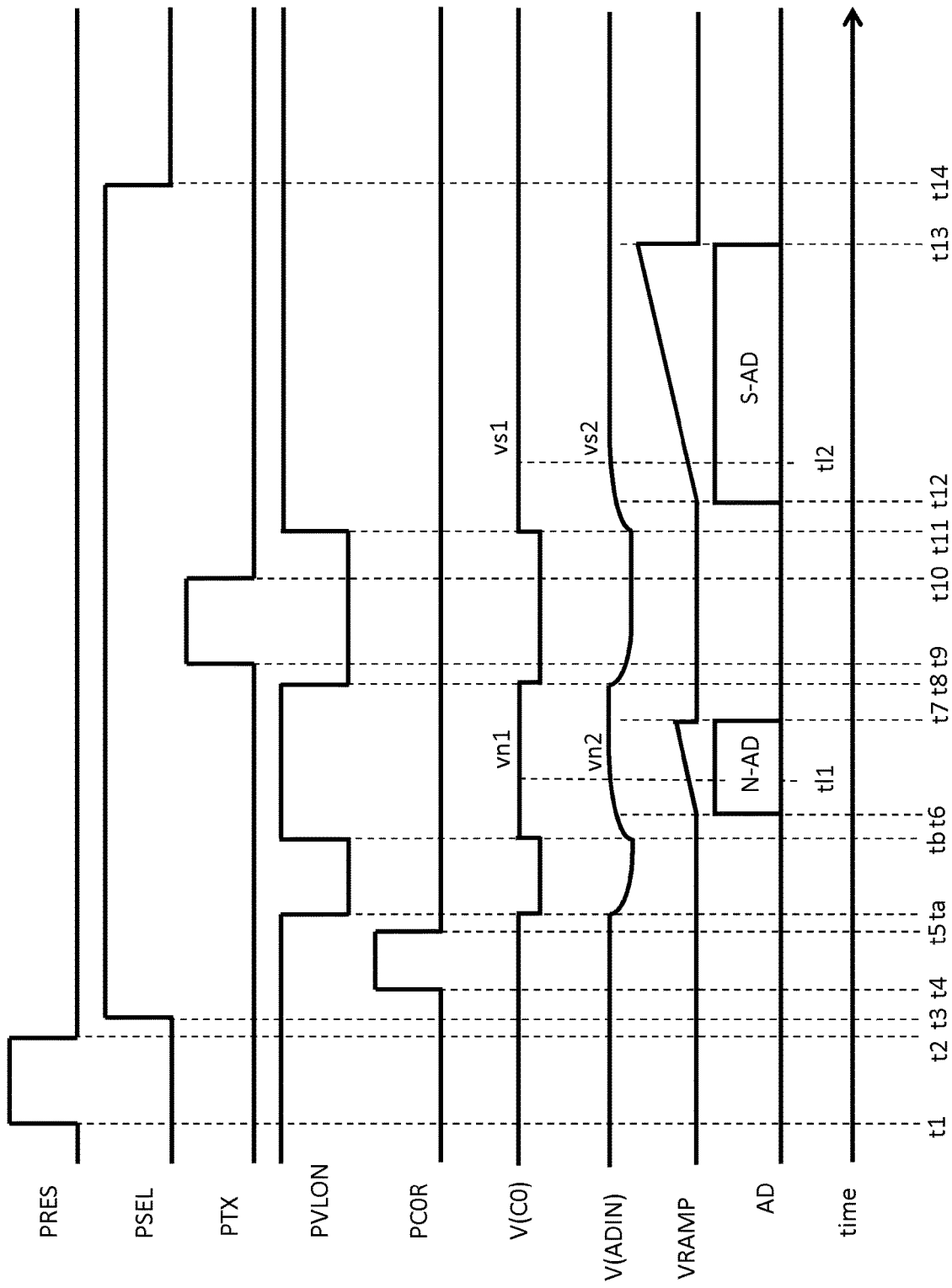
FIG. 9 is a timing chart illustrating the read-out operation in the fourth embodiment.

Referring to FIGS. 8 and 9, a fourth embodiment according to the present disclosure will be described. FIG. 8 illustrates an equivalent circuit diagram and a schematic diagram of the column circuit 109 and the column ADC 110 in the photoelectric conversion apparatus 101 in the present embodiment. The column circuit 109 includes a plurality of unit column circuits 801 arranged in the horizontal direction, while the column ADC 110 includes the plurality of unit column ADC circuits 209 arranged in the horizontal direction.

Compared to each of the unit column circuits 201 (FIG. 2) in the first embodiment, each of the unit column circuits 801 does not have the input capacitance 204, the amplifier 205, the feedback capacitance 206, and the reset switch 207 each included in the column amplifier. In other words, the unit column circuit 801 is configured to include only the cut-off switch 202 to which the control signal PVLON and the PVLONB in the phase reverse to that of the PVLON are supplied.

The unit column ADC circuit 209 is the same as that in the first embodiment (FIG. 2), and therefore a detailed description thereof is omitted. The unit column ADC circuit 209 receives a signal from the unit column circuit 801 via an AD input terminal (VADIN) 802, and outputs a digital signal resulting from the AD conversion to the column memory 111.

Thus, in the present embodiment, each of the vertical signal lines 104 is connected to the comparator 211 via the cut-off switch 202 and the capacitance 210-1.

FIG. 9 is a timing chart illustrating the read-out operation in the photoelectric conversion apparatus 101 according to the present embodiment. Even when each of the column circuits 109 has no column amplifier and does not amplify a signal, during the period t8 to t11, a transition at the AD input terminal (VADIN) 802 is slower. The reason for this will be described. To drive the capacitance 210-1, a source follower including one of the source follower transistors 119 and one of the constant current loads 106 drives the terminal (VADIN) 802 via the row selection transistor 120, the vertical signal line 104, and the cut-off switch 202. First, an ON resistance of the row selection transistor 120, an ON resistance of the cut-off switch 202, and a parasitic resistance component RL of a wiring resistance of each of the vertical signal lines 104 wired over a long distance in the pixel region 102 are generated. In addition, a parasitic capacitance component CL of each of the vertical signal lines 104 wired over the long distance in the pixel region 102 is generated. Then, when a capacitance value of the capacitance CIN-1 is reduced, a signal amplitude input to the comparator 211 decreases, and accordingly a capacitance value of several hundreds of fF to several pF is required. These parasitic resistance component RL, parasitic capacitance component CL, and capacitance CIN-1 (210-1) should be driven by the source follower. Also, a size of the source follower transistor 119 disposed in each of the unit pixels 103 is limited, and cannot be increased. In addition, since the constant current load 106 requires a large number of columns, in terms of power consumption, a current value cannot be increased. As a result, stabilization of the terminal voltage VADIN (802) becomes extremely slow during the period t8 to t11 and after the time t11. Consequently, the vs2' is not stabilized at an ideal potential.

Accordingly, in the present embodiment, even during the period ta to tb also, the control signal PVLON is transitioned to cause, even during the period ta to tb and after the time tb also, the stabilization of a potential at the terminal voltage VADIN (802) in the same manner as during the period t8 to t11 and after the time t11. The vn2' and vs2' thus obtained are at extremely close or equal potentials. The vn2' and the vs2' are respectively AD-converted during the N-AD period and during the S-AD period, and the digital signals vn2d' and vs2d' are held in the memory 111. The digital signals vn2d' and vs2d' are read out by the horizontal scanning circuit 112 after the time t14. Then, the digital signals vn2d' and vs2d' are input to the DFE 113 to be subjected to the digital signal processing. As typical processing, the subtraction processing vn2d'-vs2d' is performed to be able to cancel the offset due to insufficient stabilization of the terminal voltage VADIN resulting from the operation of the cut-off switch 202. As a result, it is possible to form a high-quality image with an extremely small offset.

Fifth Embodiment

Figure 10:
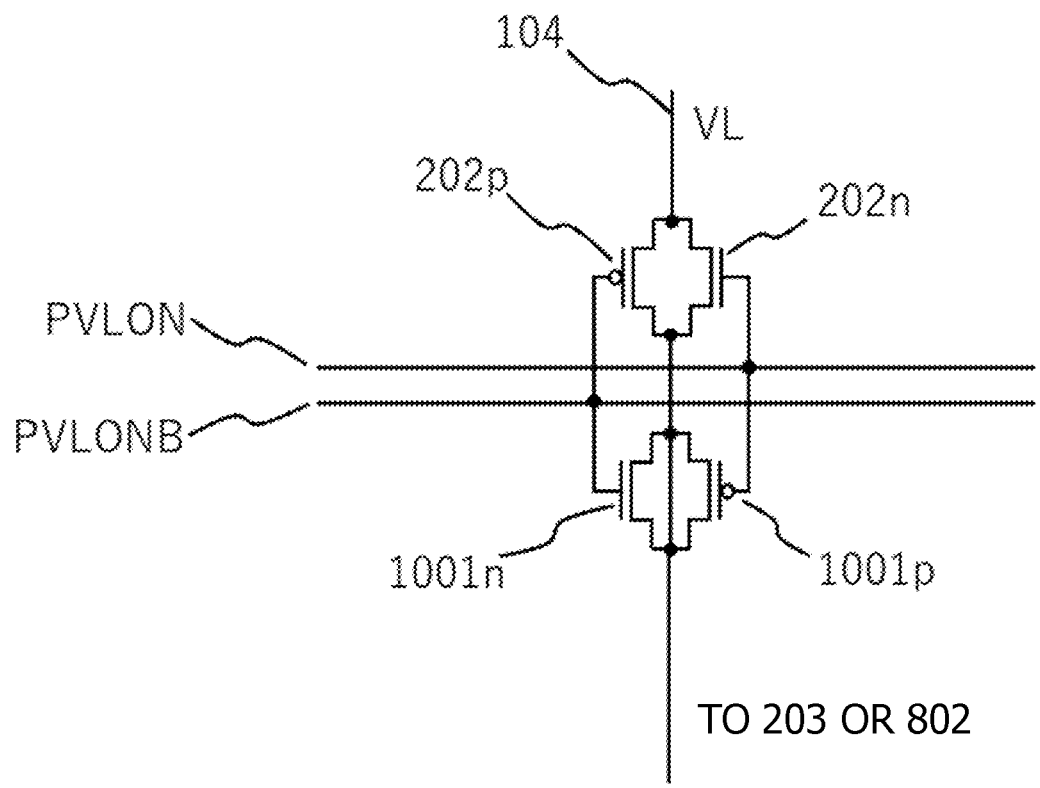
FIG. 10 is an equivalent circuit diagram in a unit circuit in a fifth embodiment.

Referring to FIG. 10, a fifth embodiment of the present disclosure will be described. The present embodiment is different from the first to fourth embodiments in a configuration of the cut-off switch 202. Note that the present embodiment can be combined with any of the first to fourth embodiments.

As illustrated in FIG. 10, the cut-off switch 202 in the present embodiment has two CMOS switch circuits. The first CMOS switch circuit includes the NMOS transistor 202$n$ and the PMOS transistor 202$p$ which are connected in parallel. The second CMOS switch circuit includes an NMOS transistor 1001$n$ and a PMOS transistor 1001$p$ which are connected in parallel to be connected subsequently to the first CMOS switch circuit. It is assumed that the NMOS transistor 202$n$ and the PMOS transistor 202$p$ have the same size (gate length and gate width), and the gate length is L, while the gate width (channel width) is W. It is assumed that each of the NMOS transistor 1001$n$ and the PMOS transistor 1001$p$ have a size including the gate length L and a gate width W×½, and is a dummy switch in which sources and drains are short-circuited.

To each of gates of the NMOS transistor 202n and the PMOS transistor 1001p, the control signal PVLON is supplied. Meanwhile, to each of gates of the PMOS transistor 202p and the NMOS transistor 1001n, the reverse-phase signal PVLONB is supplied. In other words, the control signal in the phase reverse to that of the control signal supplied to each of the gates of the NMOS transistor 202n and the PMOS transistor 1001p is supplied to each of the gates of the PMOS transistor 202p and the NMOS transistor 1001n.

Due to the presence of the dummy switches 1001n and 1001p, even though the respective sizes, gate overlap capacitances, charge injections, and thresholds of the NMOS transistor 202n and the PMOS transistor 202p are slightly different, a voltage fluctuation occurring at the VC0 during the period t8 to t11 in FIG. 3 is extremely unlikely occur. Accordingly, when the cut-off switch having the configuration shown in the present embodiment is used in the first to fourth embodiments, the offset and the dark shading are further eliminated. As a result, it is possible to form a high-quality image with an extremely small offset and effectively small dark shading.

While the present disclosure has been described by using the foregoing embodiments, the present disclosure is not limited to the embodiments described above, and is valid in a circuit including a cut-off switch.

Sixth Embodiment

Figure 11:
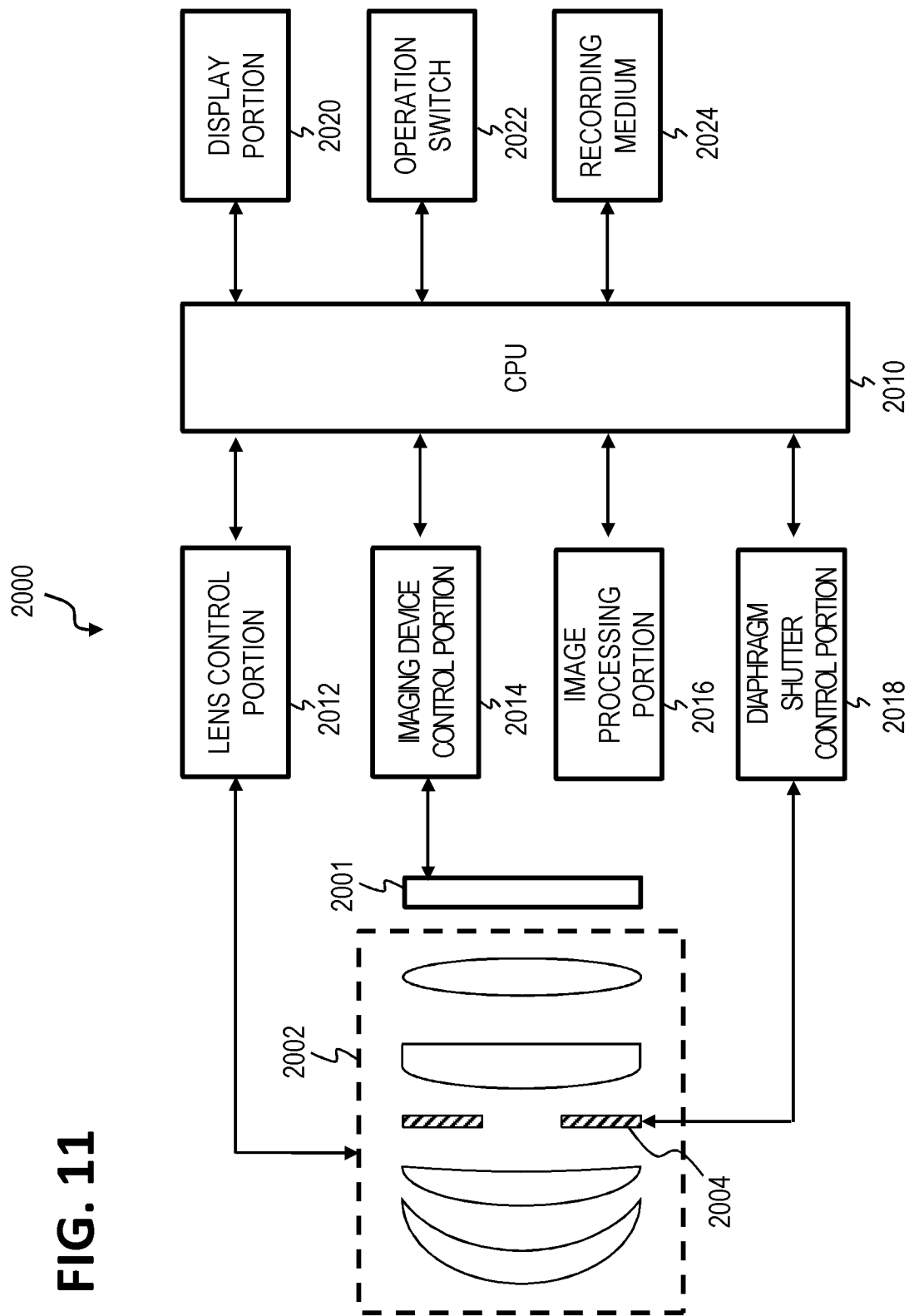
FIG. 11 is a schematic diagram of a photoelectric conversion system in a sixth embodiment.

An imaging system according to a six embodiment of the present invention will be explained with reference to FIG. 11. FIG. 11 is a block diagram of a schematic configuration of a photoelectric conversion system according to this embodiment.

The photoelectric conversion devices (solid-state imaging devices) described in the above first to fifth embodiments may apply to various photoelectric conversion systems. Applicable photoelectric conversion systems may include, but are not limited to, various types of equipment such as a digital still camera, a digital camcorder, a monitor camera, a copying machine, a facsimile, a mobile phone, an in-vehicle camera, an observation satellite, a medical camera, or the like. The photoelectric conversion systems may also include a camera module including an optical system such as a lens and a photoelectric conversion devices (solid-state imaging device). FIG. 11 is a block diagram of a digital still camera as an example of those photoelectric conversion systems.

FIG. 11 shows a photoelectric conversion system 2000, which includes a photoelectric conversion device 2001, a photoelectric conversion optical system 2002, a CPU 2010, a lens control portion 2012, a photoelectric conversion device control portion 2014, an image processing portion 2016, and a diaphragm shutter control portion 2018. The photoelectric conversion system 2000 also includes a display portion 2020, an operation switch 2022, and a recording medium 2024.

The photoelectric conversion optical system 2002 is an optical system for forming an optical image of the subject, and includes a lens group, a diaphragm 2004, or the like. The diaphragm 2004 has a function of adjusting light intensity during photography by adjusting its opening size. The diaphragm 2004 also functions as an exposure time adjustment shutter during still image photography. The lens group and the diaphragm 2004 are held movable forward and backward in the optical axis direction. These linked operations may provide a scaling function (zoom function) and a focus adjustment function. The imaging optical system 2002 may be integrated into the photoelectric conversion system or may be an imaging lens mountable to the photoelectric conversion system.

The photoelectric conversion device 2001 is disposed such that its photoelectric conversion plane is positioned in the image space of the imaging optical system 2002. The photoelectric conversion device 2001 is one of the photoelectric conversion devices (solid-state imaging devices) explained in the first to fifth embodiments. The photoelectric conversion device 2001 includes a CMOS sensor (pixel portion) and its peripheral circuits (peripheral circuit area). The photoelectric conversion device 2001 includes a plurality of pixels arranged in two dimensions, each pixel including a photoelectric conversion portion. These pixels are provided with color filters to form a two-dimensional single-plate color sensor. The photoelectric conversion device 2001 may photoelectrically convert a subject image imaged by the imaging optical system 2002 for output as an image signal and/or a focus detection signal.

The lens control portion 2012 is to control the forward and backward driving of the lens group in the imaging optical system 2002 to perform scaling operation and focus adjustment. The lens control portion 2012 includes a circuit and/or processing unit configured to achieve those functions. The diaphragm shutter control portion 2018 is to change the opening size of the diaphragm 2004 (for a variable diaphragm value) to adjust light intensity during photography, and is constituted of a circuit and/or processing unit configured to achieve those functions.

The CPU 2010 is a control unit in a camera responsible for various controls of the camera bod, and includes an operation portion, a ROM, a RAM, an A/D converter, a D/A converter, a communication interface circuit, or the like. The CPU 2010 controls the operation of each portion in the camera according to a computer program stored in a ROM or the like. The CPU 2010 performs a series of photography operations such as AF, imaging, image processing, and recording, including detection of the focus state (focus detection) of the imaging optical system 2002. The CPU 2010 also serves as a signal processing portion.

The imaging device control portion 2014 is to control the operation of the photoelectric conversion device 2001 and to A/D convert a signal output from the photoelectric conversion device 2001 and transmit the result to the CPU 2010, and includes a circuit and/or control unit configured to achieve those functions. The photoelectric conversion device 2001 may have the A/D conversion function. The image processing portion 2016 is a processing unit that subjects the A/D converted signal to processing such as y conversion and color interpolation to generate an image signal. The image processing portion 2016 includes a circuit and/or control unit configured to achieve those functions. The display portion 2020 is a display device such as a liquid crystal display device (LCD), and displays information related to a photography mode of the camera, a preview image before photography, a check image after photography, the focused state at the focus detection, or the like. The operation switch 2022 includes a power supply switch, a release (photography trigger) switch, a zoom operation switch, a photography mode selection switch, or the like. The recording medium 2024 is to record a photographed image or the like, and may be built in the photoelectric conversion system or removable such as a memory card.

In this way, the photoelectric conversion system 2000 applied with the photoelectric conversion device 2001 according to the first to fifth embodiments may provide a high performance photoelectric conversion system.

Seventh Embodiment

Figure 12A:
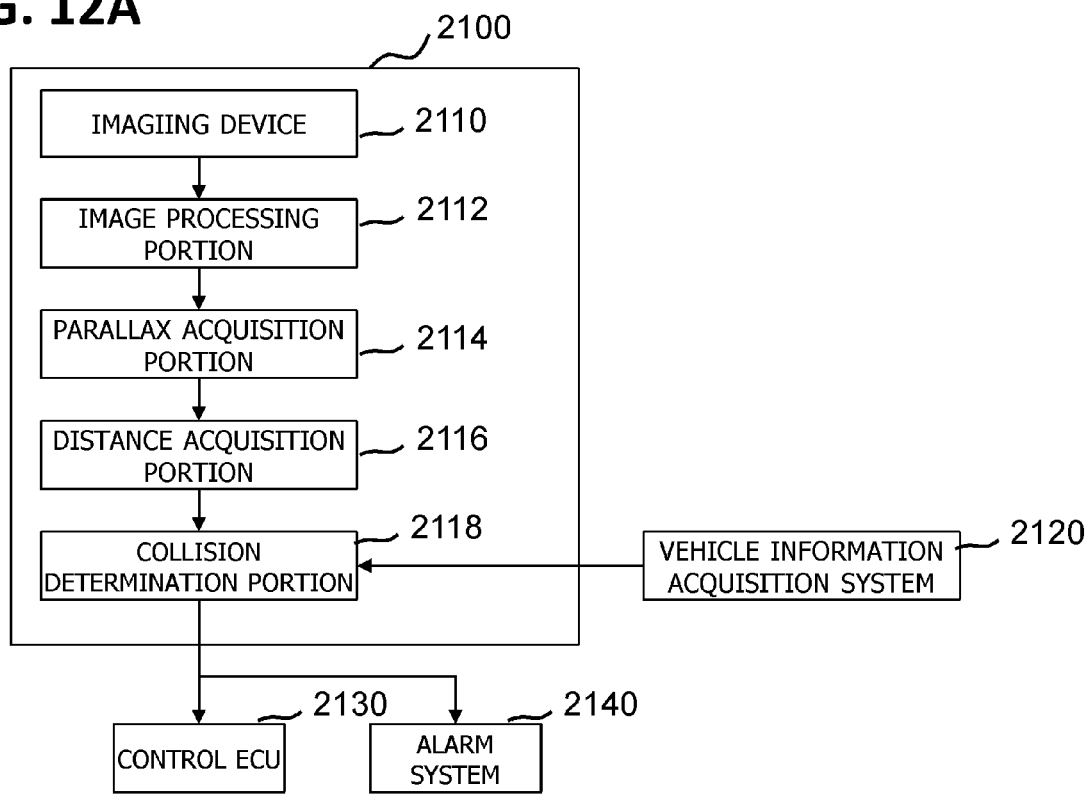
FIGS. 12A and 12B are schematic diagrams of a photoelectric conversion system and a moving body in a seventh embodiment.
Figure 12B:
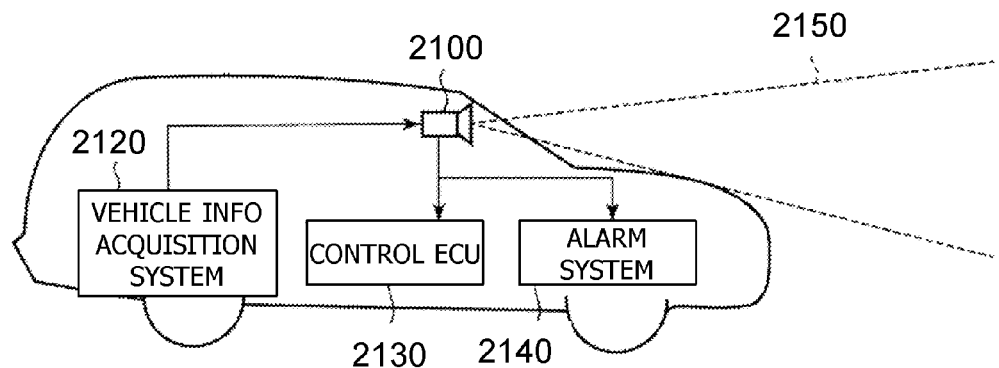

A photoelectric conversion system and a mobile object according to a seventh embodiment of the present invention will be explained with reference to FIGS. 12A and 12B. FIGS. 12A and 12B show configurations of the photoelectric conversion system and mobile object according to this embodiment.

FIG. 12A shows an example of a photoelectric conversion system 2100 associated with an in-vehicle camera. The photoelectric conversion system 2100 has a photoelectric conversion device 2110. The photoelectric conversion device 2110 is any one of the photoelectric conversion devices (solid-state imaging devices) according to the above first to fifth embodiments. The photoelectric conversion system 2100 has an image processing portion 2112 and a parallax acquisition portion 2114. The image processing portion 2112 is a processing unit that subjects a plurality of sets of image data acquired by the photoelectric conversion device 2110 to image processing. The parallax acquisition portion 2114 is a processing unit that calculates parallax (a phase difference of a parallax image) from the sets of image data acquired by the photoelectric conversion device 2110. The photoelectric conversion system 2100 also includes a distance acquisition portion 2116, which is a processing unit that calculates the distance to the subject based on the calculated parallax. The photoelectric conversion system 2100 also includes a collision determination portion 2118, which is a processing unit that determines a possibility of collision based on the calculated distance. Here, the parallax acquisition portion 2114 and the distance acquisition portion 2116 are examples of information acquiring means that acquires information such as distance information to the subject. In other words, the distance information is information related to parallax, defocus amount, the distance to the subject, or the like. The collision determination portion 2118 may determine a possibility of collision using any of the distance information. The above processing unit may be provided by specially designed hardware or may be provided by general hardware that performs operation based on a software module. In addition, the processing unit may be provided by a Field Programmable Gate Array (FPGA), an Application Specific Integrated Circuit (ASIC), or the like or may be provided by a combination thereof.

The photoelectric conversion system 2100 is connected to a vehicle information acquisition system 2120, and may thus acquire vehicle information including a vehicle speed, a yaw rate, and a rudder angle. The photoelectric conversion system 2100 also has a control ECU 2130 connected thereto. The ECU 2130 is a control unit that outputs a control signal for generating a braking force to the vehicle based on the determination by the collision determination portion 2118. In other words, the control ECU 2130 is an example of a mobile object control means that controls a mobile object based on the distance information. The photoelectric conversion system 2100 is also connected to an alarm system 2140. The alarm system 2140 gives an alarm to the driver based on the determination by the collision determination portion 2118. For example, if the collision determination portion 2118 determines a high possibility of collision, the control ECU 2130 performs a vehicle control that avoids collision and reduces damage by braking, releasing the accelerator, limiting the engine output, or the like. The alarm system 2140 warns the user by sounding an alarm such as sound, displaying alarm information on a screen of a car navigation system or the like, giving vibration to a seatbelt and steering, or the like.

In this embodiment, the surroundings of the vehicle such as front or rear are imaged by the photoelectric conversion system 2100. FIG. 12B shows the photoelectric conversion system 2100 when photoelectric conversion the front of the vehicle (imaging range 2150). The vehicle information acquisition system 2120 directs the photoelectric conversion system 2100 to operate and perform imaging. Using the photoelectric conversion devices according to the above first to fifth embodiments as the photoelectric conversion device 2110, the photoelectric conversion system 2100 in this embodiment may provide more improved ranging accuracy.

Although the above description shows an example control that prevents collision with other vehicles, the present invention may also apply to a control of autonomous driving following other vehicles, a control of autonomous driving preventing running over a traffic lane, or the like. In addition to a vehicle such as a car, the photoelectric conversion system may also apply to, for example, a mobile object (transportation equipment) such as a vessel, an aircraft, or an industrial robot. The moving device in the mobile object (transportation equipment) is one of various types of drive sources, including an engine, a motor, a wheel, and a propeller. In addition to a mobile object, the photoelectric conversion system may also apply to equipment, such as Intelligent Transport Systems (ITS), that commonly uses the object recognition.

OTHER EMBODIMENTS

The photoelectric conversion apparatus described above may have a structure (a chip stack structure) in which a first semiconductor chip provided with pixels and a second semiconductor chip provided with readout circuits (peripheral circuits) are stacked. Each of the readout circuits (peripheral circuits) in the second semiconductor chip can be configured as a column circuit that corresponds to a pixel column in the first semiconductor chip. Alternatively, each of the readout circuits (peripheral circuits) in the second semiconductor chip can be configured as a matrix circuit that corresponds to a pixel or a pixel block in the first semiconductor chip. As a connection between the first semiconductor chip and the second semiconductor chip, a through-electrode (TSV), inter-chip wiring by a direct bond using a metal such as copper (Cu), an inter-chip microbump, or the like can be adopted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-028278, filed on Feb. 25, 2022, which is hereby incorporated by reference herein in its entirety.

What is claimed is:

1. A photoelectric conversion apparatus comprising:
a pixel array having a plurality of pixels each including a photodiode, a floating diffusion, and a transfer transistor configured to transfer a charge from the photodiode;
a signal line to which pixel signals are output from the pixels;
a processing circuit configured to process the pixel signals in the signal line;

a switch configured to control conduction between the signal line and an input node of the processing circuit; and a control unit, wherein the control unit is configured to perform a first transition in which, after resetting of the processing circuit, the switch is transitioned to an OFF state and then, during a period after resetting of the floating diffusion during which the pixel signals are read out of the pixels into the signal line, the switch is transitioned at least from the OFF state to an ON state, wherein the resetting of the processing circuit is performed after the resetting of the floating diffusion, wherein the control unit is configured to keep the switch in the OFF state during a period during which the transfer transistor is performing the transfer, and wherein the control unit is configured to perform a second transition in which, after the transfer, the switch is transitioned from the OFF state to the ON state.

2. The photoelectric conversion apparatus according to claim 1, wherein the signal line is connected, by capacitive coupling, to the processing circuit via the switch.

3. The photoelectric conversion apparatus according to claim 1, wherein the processing circuit comprises a capacitive feedback type amplifier.

4. The photoelectric conversion apparatus according to claim 2, wherein the processing circuit comprises a capacitive feedback type amplifier.

5. The photoelectric conversion apparatus according to claim 1,
wherein the switch includes an NMOS transistor and a PMOS transistor which are connected in parallel, and
wherein the NMOS transistor and the PMOS transistor are driven by signals with logic levels opposite to each other.

6. The photoelectric conversion apparatus according to claim 2,
wherein the switch includes an NMOS transistor and a PMOS transistor which are connected in parallel, and
wherein the NMOS transistor and the PMOS transistor are driven by signals with logic levels opposite to each other.

7. The photoelectric conversion apparatus according to claim 3,
wherein the switch includes an NMOS transistor and a PMOS transistor which are connected in parallel, and
wherein the NMOS transistor and the PMOS transistor are driven by signals with logic levels opposite to each other.

8. The photoelectric conversion apparatus according to claim 4,
wherein the switch includes an NMOS transistor and a PMOS transistor which are connected in parallel, and
wherein the NMOS transistor and the PMOS transistor are driven by signals with logic levels opposite to each other.

9. The photoelectric conversion apparatus according to claim 5, wherein the NMOS transistor and the PMOS transistor each included in the switch have a same size.

10. The photoelectric conversion apparatus according to claim 1,
wherein the first transition is performed before a reset signal, which is a pixel signal before the transfer is performed by the transfer transistor, is AD-converted, and
wherein the second transition is performed after the reset signal is AD-converted and before a pixel signal after the transfer is performed by the transistor is AD-converted.

11. The photoelectric conversion apparatus according to claim 1,
wherein the signal line is provided in plurality to correspond to pixel columns in the pixel array,
wherein the switch is provided for each of the signal lines, and
wherein control signals for controlling a plurality of switches are input from one side of the plurality of switches in a horizontal direction.

12. The photoelectric conversion apparatus according to claim 1,
wherein the switch includes:
a first switch including a first NMOS transistor and a first PMOS transistor which have a same size and are connected in parallel; and
a second switch including a second NMOS transistor and a second PMOS transistor which have channel widths each corresponding to ½ of that of each of the first NMOS transistor and the first PMOS transistor and are connected in parallel,
wherein the second switch is a dummy switch in which sources and drains are short-circuited,
wherein the second switch is provided between the first switch and the input node of the processing circuit,
wherein, to respective gates of the first NMOS transistor and the first PMOS transistor, signals in reverse phases are supplied,
wherein, to the second NMOS transistor, a signal in a phase reverse to that of the signal supplied to the gate of the first NMOS transistor is supplied, and
wherein, to the second PMOS transistor, a signal in a phase reverse to that of the signal supplied to the gate of the first PMOS transistor is supplied.

13. The photoelectric conversion apparatus according to claim 1, wherein a first substrate provided with the pixel array and a second substrate provided with the processing circuit are stacked in layers.

14. A photoelectric conversion system comprising:
the photoelectric conversion apparatus according to claim 1; and
a signal processing unit configured to process a signal output from the photoelectric conversion apparatus.

15. A moving body comprising:
the photoelectric conversion apparatus according to claim 1;
a moving apparatus;
a processing apparatus configured to acquire information from a signal output from the photoelectric conversion apparatus; and
a control apparatus configured to control the moving apparatus on the basis of the information.

* * * * *